(12) United States Patent
Mlcak et al.

(10) Patent No.: US 6,953,977 B2
(45) Date of Patent: Oct. 11, 2005

(54) MICROMECHANICAL PIEZOELECTRIC DEVICE

(75) Inventors: Richard Mlcak, Cambridge, MA (US); Dharanipal Doppalapudi, Somerville, MA (US); Harry L. Tuller, Wellesley, MA (US)

(73) Assignee: Boston MicroSystems, Inc., Woburn, MA (US)

( * ) Notice: Subject to any disclaimer, the term of this patent is extended or adjusted under 35 U.S.C. 154(b) by 86 days.

(21) Appl. No.: 10/284,048

(22) Filed: Oct. 29, 2002

(65) Prior Publication Data

US 2003/0119220 A1 Jun. 26, 2003

Related U.S. Application Data

(63) Continuation-in-part of application No. 09/500,407, filed on Feb. 8, 2000, now Pat. No. 6,627,965.

(51) Int. Cl.[7] .............................................. H01L 27/14
(52) U.S. Cl. ........................ 257/414; 257/415; 257/421
(58) Field of Search ................................ 257/414–419, 257/421

(56) References Cited

U.S. PATENT DOCUMENTS

| | | |
|---|---|---|
| 4,511,816 A | 4/1985 | Mikoshiba et al. |
| 4,744,863 A | 5/1988 | Guckel et al. |
| 4,783,237 A | 11/1988 | Aine et al. |
| 4,839,708 A | 6/1989 | Kano et al. |
| 4,849,071 A | 7/1989 | Evans et al. |
| 4,993,143 A | 2/1991 | Sidner et al. |
| 5,165,283 A | 11/1992 | Kurtz et al. |
| 5,237,182 A | 8/1993 | Kitagawa et al. |
| 5,303,594 A | 4/1994 | Kurtz et al. |
| 5,338,416 A | 8/1994 | Mlcak et al. |
| 5,446,330 A | 8/1995 | Eda et al. |
| 5,464,509 A | 11/1995 | Mlcak et al. |
| 5,470,797 A | 11/1995 | Mastrangelo |
| 5,520,785 A | 5/1996 | Evans et al. |
| 5,549,006 A | 8/1996 | Kurtz |
| 5,587,014 A | 12/1996 | Iyechika et al. |
| 5,604,144 A | 2/1997 | Kurtz |
| 5,631,198 A | 5/1997 | Hartauer |
| 5,633,616 A | 5/1997 | Goto |
| 5,715,337 A * | 2/1998 | Spitzer et al. ................. 385/4 |
| 5,759,870 A | 6/1998 | Yun et al. |
| 5,847,397 A | 12/1998 | Moustakas |
| 5,903,017 A | 5/1999 | Itaya et al. |
| 5,966,053 A | 10/1999 | Dürig et al. |
| 6,069,021 A | 5/2000 | Terashima et al. |
| 6,087,701 A | 7/2000 | Bergstrom et al. |
| 6,110,278 A | 8/2000 | Saxena |
| 6,147,364 A | 11/2000 | Itaya et al. |
| 6,150,674 A | 11/2000 | Yuri et al. |
| 6,177,292 B1 | 1/2001 | Hong et al. |
| 6,194,744 B1 | 2/2001 | Udagawa et al. |
| 6,232,139 B1 * | 5/2001 | Casalnuovo et al. .......... 438/48 |
| 6,268,629 B1 | 7/2001 | Noguchi |

(Continued)

OTHER PUBLICATIONS

"Photoelectrochemical etching of semiconductors" IBM Journal of Research and Development vol. 42, No. 5, 1998.*

(Continued)

*Primary Examiner*—Brad Smith
(74) *Attorney, Agent, or Firm*—Hamilton, Brook, Smith & Reynolds, P.C.

(57) ABSTRACT

A micromechanical device includes a single crystal micromachined micromechanical structure. At least a portion of the micromechanical structure is capable of performing a mechanical motion. A piezoelectric epitaxial layer covers at least a part of said portion of the micromechanical structure that is capable of performing a mechanical motion. The micromechanical structure and piezoelectric epitaxial layer are composed of different materials. At least one electrically conducting layer is formed to cover at least part of the piezoelectric epitaxial layer.

33 Claims, 8 Drawing Sheets

U.S. PATENT DOCUMENTS

| | | |
|---|---|---|
| 6,275,137 B1 | 8/2001 | Doppalapudi et al. |
| 6,290,774 B1 | 9/2001 | Solomon et al. |
| 2001/0002048 A1 | 5/2001 | Koike et al. |
| 2001/0008656 A1 | 7/2001 | Tischler et al. |
| 2001/0026981 A1 | 10/2001 | Bower et al. |
| 2001/0030316 A1 | 10/2001 | Kuramoto et al. |

OTHER PUBLICATIONS

Tuller, H.L. and Mlcak, R., "Photo–assisted Silicon Micromachining: Opportunities for Chemical Sensing," *Sensors and Actuators*, pp. 255–261 (1996).

Foresi, J.S. and Moustakas, T.D., "Piezoresistance and Quantum Confinement in Microcrystalline Silicon," *Mat. Res. Soc. Symp. Proc.* vol. 256, 77–82 (1992).

Lei T., et al., "Epitaxial Growth and Characterization of Zinc–blende Gallium Nitride on (001) Silicon," *J. Appl. Phys.*, 71(10) :4933–4943 (1992).

Stevens, K.S., et al., "Microstructure of AlN on Si (111) Grown by Plasma–assisted Molecular Beam Epitaxy,"*Appl. Phys. Lett.*, 65 (3) :321–323 (1994).

Basu, S.N., et al., "Microstructures of GaN Films Deposited on (001) and (111) Si Substrates Using Electron Cyclotron Resonance Assisted–molecular Beam Epitaxy," *J. Mater. Res.*, 9 (9) :2370–2378 (1994).

Marchand, H., et al., "Structural and Optical Properties of GaN Laterally Overgrown on Si (111) by Metalorganic Chemical Vapor Deposition Using an AIN Buffer Layer," *MRS Internet Journal Nitride Semiconductor Research*, 4 (2) : 1–10 (1999).

Hellman, E.S., et al., "Nucleation of AlN on the (7 ×7) Reconstructed Silicon (1 1 1) Surface," *MRS Internet Journal Nitride Semiconductor Research*, 3 (43) : 1–5 (1998).

Ziermann, R., et al., "A High Temperature Pressure Sensor With $\beta$–SiC Piezoresistors On SOI Substrates," International Conference on Solid–State Sensors and Actuators, Chicago, IL, Jun. 16–19, 1997.

Okojie, R.S., et al., "Operation of $\alpha$ (6H) SiC Pressure Sensor at 500° C," *Sensors and Actuators*, A 66 :200–204 (1998).

von Berg, J., et al., "High Temperature Piezoresistive $\beta$–SiC–on–SOI Pressure Sensor for Combustion Engines," *Materials Science Forum*, 264–268:1101–1104 (1998).

Okojie, R.S., et al., "$\alpha$ (6H) – SiC Pressure Sensors for High Temperature Applications," *IEEE the Ninth Annual International Workshop on Micro Electro Mechanical Systems*, pp. 146–149 (1996).

Bartek, M., et al., Vacuum Sealing of Microcavities Using Metal Evaporating, *Sensors and Actuators*, A 61:364–368 (1997).

Eickhoff, M., et al., "Accelerated Aging of Micromachined Silicon/Siliconcarbide Diaphragms by the Application of Pressure and Temperature," contribution to Micro Materials 1997 Conference, Berlin, Germany (Apr. 1997).

Shor, J.S., et al., "SiC Microsensor with Piezoresistive Diamond Sensing Elements," (Report No. ARO 30676.1–EL–SBI). U.S. Army Research Office, Research Triangle Park, NC (1992).

Perkins, N.R., et al., "Halide Vapor Phase Epitaxy of Gallium Nitride Films on a Sapphire and Silicon Substrates," *Mat. Res. Soc. Symp. Proc.* 395:243–249 (1996).

\* cited by examiner

MICROMECHANICAL PIEZOELECTRIC DEVICE

RELATED APPLICATION

This application is a continuation-in-part of U.S. application Ser. No. 09/500,407, filed Feb. 8, 2000, now U.S. Pat. No. 6,627,965, issued Sep. 30, 2003, the entire teachings of which are incorporated herein by reference.

GOVERNMENT SUPPORT

The invention was supported, in whole or in part, by the Naval Research Lab, Contract #N00173-01-P-1646. The Government has certain rights in the invention.

BACKGROUND

Miniaturized devices, such as actuators, micro-optics, micro-fluidics, resonators tunable electronics (mechanical filters), scanning probe microscope tips, micropower generators, and sensors (for example, temperature, pressure, acceleration, flow, radiation, chemical species etc.) sometimes include micromechanical structures formed from semiconductor materials. The micromechanical structures can be, for example, a membrane, cantilever beam, or tethered proof mass, etc., which is designed to be perturbed by external stimuli when used as a sensor, or to produce a motion when used as an actuator. Typically, the micromechanical structures are micromachined by an etching process. In some instances, a film of polycrystalline material is deposited over the micromechanical structure to provide the micromechanical structure with additional properties. For example, the film may have piezoresistive, piezoelectric, etc., properties. A drawback of polycrystalline films is that it is difficult to produce polycrystalline films that have consistent or uniform properties. In addition, some desirable functional properties are not provided by polycrystalline films. Furthermore, polycrystalline films are usually less stable at high temperatures and corrosive environments which restricts operation of devices including these films to lower temperatures and less corrosive environments.

SUMMARY

The present invention provides a micromechanical device with highly reproducible properties and improved functionality that is capable of operating at higher temperatures and in more corrosive environments than previous devices. The micromechanical device includes a single crystal micromachined micromechanical structure. At least a portion of the micromechanical structure is capable of performing a mechanical motion. A piezoelectric epitaxial layer covers at least a part of said portion of the micromechanical structure that is capable of performing a mechanical motion. The micromechanical structure and the piezoelectric epitaxial layer are formed of different materials. At least one electrically conductive layer covers at least part of the piezoelectric epitaxial layer.

In preferred embodiments, the micromechanical structure and piezoelectric epitaxial layer are each formed from a material selected from the group consisting of group IV, III-V, II-VI and IV-VI semiconductors. In particular, the micromechanical structure is preferably formed from a material selected from the group of solids consisting of (111) Si, 6H—SiC (0001) or 4H—SiC (0001). The piezoelectric epitaxial layer is preferably formed from a material selected from the group of solid solutions consisting of $Al_xGa_yIn_zN$ (aluminum gallium indium nitride) where $x+y+z=1$. In most cases, AlN (aluminum nitride) is preferred since AlN has superior piezoelectric properties. In one embodiment, the piezoelectric epitaxial layer is deposited before the micromechanical structure is formed. In another embodiment, the piezoelectric epitaxial layer is deposited on the micromechanical structure after the micromechanical structure is formed. The function of the piezoelectric epitaxial layer is dependent upon the application. In one embodiment, the piezoelectric epitaxial layer provides a measurable response to external stimulation of the micromechanical device. In another embodiment, the piezoelectric epitaxial layer provides a means for inducing motion of the micromechanical device in response to an electrical power or signal. Depending upon the application and the materials chosen, the micromechanical device may be a sensor, an actuator, an electronic device or an optoelectronic device.

In other embodiments, the micromechanical structure can be formed from an electrically conductive semiconductor substrate. At least one electrical contact formed to the micromechanical structure is electrically connected to the portion of the micromechanical structure that is capable of performing a mechanical motion. An electrical source is connected between at least one electrically conductive layer covering at least part of the piezoelectric epitaxial layer and at least one electrical contact formed to the micromechanical structure. A measuring device is connected between at least one electrically conductive layer covering at least part of the piezoelectric epitaxial layer and at least one electrical contact formed to the micromechanical structure. A substance sensitive layer can be formed over at least a portion of the micromechanical structure that is capable of performing a mechanical motion.

In further embodiments, the at least one electrically conductive layer covering at least part of the piezoelectric epitaxial layer can be one or more interdigital electrodes.

The micromechanical structure can be formed from a substrate having a p-type region over a first n-type region such that the portion of the micromechanical structure capable of performing a mechanical motion is composed of a portion of the p-type region suspended over a cavity in the n-type region. At least one electrical contact is formed to the p-type region of the micromechanical structure and is electrically connected via the p-type region to the portion of the micromechanical structure capable of performing a mechanical motion. The micromechanical structure can be one of a microcantilever, microbridge, membrane, perforated membrane, tethered proof mass, or tethered plate. In one embodiment, the substrate further includes a second n-type region over at least a portion of the p-type region such that at least a portion of the micromechanical structure capable of performing a mechanical motion is composed of the second n-type region covering a p-type region. At least one electrical contact is formed to the second n-type region of the micromechanical structure and is electrically connected via the second n-type region to the portion of the micromechanical structure capable of performing a mechanical motion.

In the present invention, since the micromechanical structure and the piezoelectric epitaxial layer are each preferably formed from a single crystal material, the resulting properties (mechanical, electrical, optical, etc.) of the micromechanical device are more readily reproduced employing known micromachining and thin film deposition techniques. In addition, single crystal materials which are stable at high temperatures and in harsh environments can be used. This allows the present invention micromechanical device to be used in a wider range of applications than is possible with devices having polycrystalline films which are susceptible to microstructure changes and preferential attack at grain boundaries. For example, with the appropriate selection of materials, devices of the present invention can operate with greater functionality at temperatures exceeding 800° C. as well as in environments found in gas turbines, internal combustion engines, chemical reactors and industrial process equipment. The combination of a micromechanical structure formed of 6H—SiC or 4H—SiC with a piezoelectric epitaxial layer formed of solid solutions of AlGaInN, for example, AlN, provides a piezoelectric device formed of optimum materials for withstanding and operating within harsh conditions.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
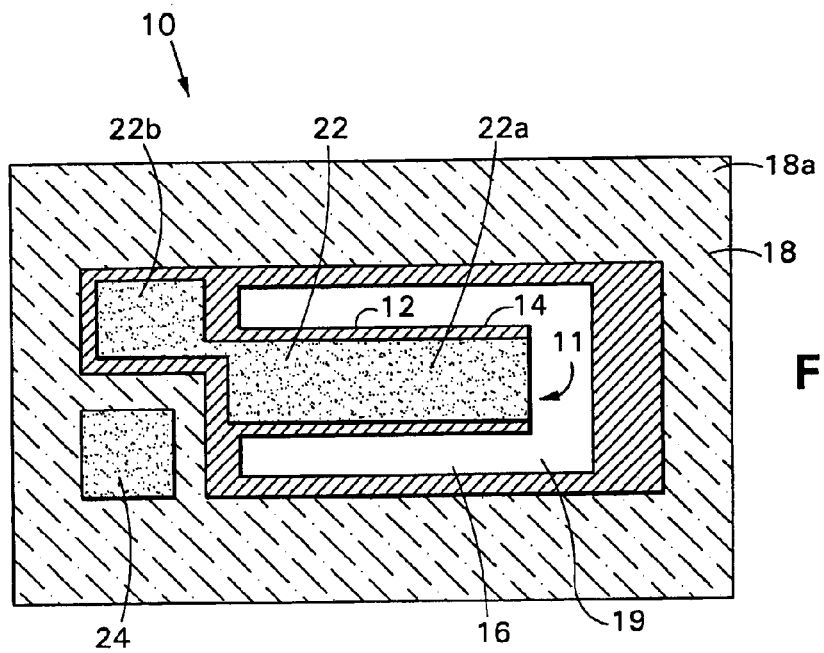
FIG. 1A is a plan view of an embodiment of a micromechanical piezoelectric device of the present invention having a piezoelectric epitaxial layer.
Figure 1B:
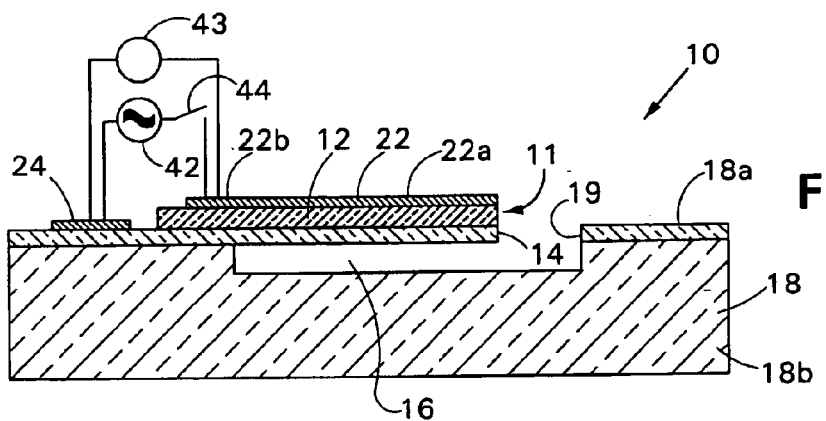
FIG. 1B is a side sectional view of the piezoelectric device of FIG. 1A.
Figure 1C:
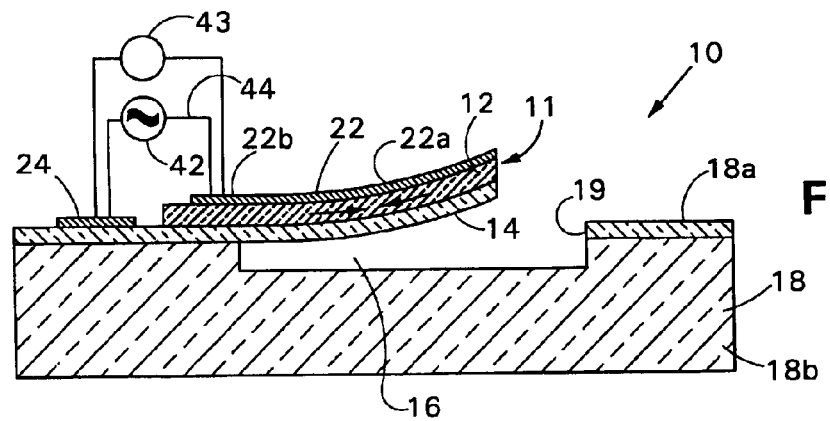
FIG. 1C is a side sectional view of the piezoelectric device of FIG. 1A with the micromechanical structure deflected by applying a voltage across the piezoelectric layer.

Referring to FIGS. 1A, 1B and 1C, micromechanical piezoelectric device 10 is an embodiment of a piezoelectric microcantilever which is one example of a micromechanical piezoelectric device of the present invention. Micromechanical piezoelectric device 10 includes a single crystal semiconductor base substrate 18 having an upper region 18a and a lower region 18b where one region is n-type and the other region is p-type. A pattern 19 is etched through the upper region 18a of base substrate 18. A cavity 16 extending from pattern 19 is etched within the lower region 18b and under the upper region 18a, thereby forming a micromechanical structure 14. Although micromechanical structure 14 is shown as a cantilevered beam, it is understood that micromechanical structure 14 can be a number of other structures such as a microbridge, membrane, perforated membrane, tethered proof mass, etc. An epitaxial layer of single crystal piezoelectric material 12 is formed over at least a part of the portion of the micromechanical structure 14 that is capable of performing a mechanical motion. The epitaxial layer 12 continues slightly beyond micromechanical structure 14 and over the portion of substrate 18 from which micromechanical structure 14 extends. The epitaxial layer 12 closely registers with the crystalline structure of base substrate 18 and for all practical purposes is considered a single crystalline film. However, it is understood that minor defects may exist in epitaxial layer 12 such as inclusions or low angle grain boundaries. In addition, epitaxial layer 12 may have a highly oriented columnar structure with some lattice mosaic in the film. Micromechanical structure 14 and piezoelectric layer 12 form a piezoelectric bimorph 11 capable of performing a mechanical motion. A metal layer or film 22 is formed over the piezoelectric layer 12 and extends beyond the piezoelectric bimorph 11. The metal layer 22 forms an upper electrode 22a and a first electrical contact region 22b for piezoelectric device 10. Another metal layer or film is formed on the upper region 18a of base substrate 18 adjacent to piezoelectric layer 12, thereby forming a second electrical contact 24 for piezoelectric device 10. The micromechanical structure 14 is an electrically conductive semiconductor and serves as the bottom electrode to the piezoelectric layer 12. An electrical power or signal source 42 can be electrically connected to piezoelectric device 10 through contacts 22b and 24. Electrical power or signals to piezoelectric device 10 can be turned on and off by a switch 44. A measuring device 43 (voltmeter, oscilloscope, electrical circuit, etc.) capable of measuring the signal generated by piezoelectric device 10 may be electrically connected to piezoelectric device 10 through contacts 22b and 24.

Referring to FIG. 1C, when switch 44 is closed, a voltage or electrical signal from power source 42 can be provided to the piezoelectric layer 12 on micromechanical structure 14 via contacts 22b and 24. Once piezoelectric layer 12 is charged with the voltage or electrical signal, the piezoelectric layer 12 either expands or contracts in both its lateral and vertical dimensions. Since the micromechanical structure 14 itself is not piezoelectric and does not expand or contract in response to the voltage or electrical signal, the expanding or contracting piezoelectric layer 12 causes the piezoelectric bimorph 11 to bend. In FIG. 1C, the piezoelectric layer 12 is shown to contract in the direction of the arrows and, as a result, the piezoelectric bimorph 11 bends upwardly, in the direction of the side of piezoelectric layer 12. If the piezoelectric layer 12 were expanded then the piezoelectric bimorph 11 would bend downwardly, in the direction of the side of micromechanical structure 14. Depending upon the application at hand, power source 42 can provide a continuous electrical signal to cause the piezoelectric bimorph 11 to bend either up or down by a fixed amount, or a time varying signal to drive the piezoelectric bimorph 11 in motion, or an oscillating signal at a frequency corresponding to a resonant frequency of piezoelectric bimorph 11 to drive the piezoelectric bimorph 11 to resonance.

By selection of the micromechanical structure 14 (cantilevered beam, microbridge, membrane, perforated membrane, tethered proof mass, tethered plate, etc.), piezoelectric bimorph 11 can form a variety of different devices. Such devices can include microresonator sensors (for example, for detecting temperature, pressure, acceleration, flow, etc.), piezoelectric microphones, flexural plate wave fluidic sensors, microactuators, addressable micromirrors for optical projection, devices for wireless communications (resonators, filters, switches, etc.), and scanning probe microscope tips. Commonly, when micromechanical structure 14 is a cantilevered beam, micromechanical piezoelectric device 10 can be a temperature sensor, viscosity sensor, pressure sensor, flow sensor, accelerometer, resonator or actuator; when micromechanical structure 14 is a microbridge, piezoelectric device 10 can be a resonator or electromechanical filter; when micromechanical structure 14 is a membrane, piezoelectric device 10 can be an actuator, pressure sensor or flexural plate wave fluid sensor; when micromechanical structure 14 is a perforated membrane, piezoelectric device 10 can be a microphone or flexural plate wave fluid sensor; when micromechanical structure 14 is a tethered proof mass, piezoelectric device 10 can be an accelerometer; and when micromechanical structure 14 is a tethered plate, piezoelectric device 10 can be a addressable micromirror for optical projection.

In example, when piezoelectric device 10 is used as a sensor; the piezoelectric bimorph 11 is perturbed by external stimuli such as exposure to acoustic waves, pressure, inertial changes, temperature changes, fluid viscosity changes, density changes, etc. Piezoelectric device 10 can be employed as a resonant sensor, where the electrical contacts 22b/24 are used to both provide the electrical signals to the piezoelectric film 12 to drive the piezoelectric device 10 into resonance as well as to provide electrical contact to an appropriate device 43 for measuring the response to the stimulus, for example, detecting the shift in resonant frequency. Such a shift in resonant frequency can then be correlated into the magnitude of the measured stimulus. A bimorph device as in the present invention can have sensitivities and signal to noise ratios much higher than unimorph piezoelectric devices. In some embodiments, the piezoelectric bimorph 11 is not forced into motion by a voltage, so that movement of the piezoelectric bimorph 11 is solely caused by external stimuli. In such cases, when measuring the response of the piezoelectric device 10 to an external stimulus (for example, a sound wave), the stress induced in the piezoelectric film 12 by the external stimulus generates a voltage across the electrodes 22b/24 which is measured by device 43, and then provides a measure of the phenomenon that caused the deflection. When piezoelectric device 10 is employed as an actuator, a voltage is provided to piezoelectric device 10 to cause movement of piezoelectric bimorph 11 in order to perform a desired mechanical function. It is understood that in some applications, piezoelectric device 10 can include both power source 42 and measuring device 43, while in other applications, piezoelectric device 40 can include only one of power source 42 and measuring device 43.

A more detailed description of piezoelectric device 10 now follows. It is understood that the micromechanical structure 14 can be made from a wide range of single crystal semiconductor materials. Although piezoelectric layer 12 may be formed of many different materials, the material of piezoelectric layer 12 is selected to be compatible with the material of the base substrate from which the micromechanical structure 14 is formed. Piezoelectric layer 12 must have a crystal structure which is compatible to that of the base substrate of the micromechanical structure in order for the layer to grow epitaxially on the base substrate. Alternatively, the material of the semiconductor base substrate may be selected to match a particular piezoelectric material. Piezoelectric layer 12 is a single crystal or a highly oriented columnar structure with a certain degree of lattice mosaic in the film, depending on the lattice match (in dimensions as well as surface symmetry) between the piezoelectric layer and the base substrate.

The properties of piezoelectric device 10 depends on the electrical and mechanical properties of the materials from which it is made. The properties of single crystal materials are of higher quality and more reproducible (from batch to batch) than polycrystalline films. A single crystal piezoelectric layer 12 has more consistent and optimum electromechanical properties (piezoelectric coefficients, coupling constants, internal stresses). The single crystal piezoelectric layer 12 is not as susceptible to cracking as polycrystalline piezoelectric films, and single crystal materials are typically more resistant to chemical attach than polycrystalline films.

The base substrate 18 is typically formed from single crystal 6H—SiC or 4H—SiC (silicon carbide), or (111) Si (silicon), and the piezoelectric layer 12 is typically epitaxially grown from III-V nitride semiconductor material, commonly, solid solutions of $Al_xGa_yIn_zN$ (aluminum gallium indium nitride) where x+y+z=1. The III-V nitrides are wide band gap semiconductors and remain stable in the piezoelectric phase at elevated temperatures. Furthermore, the III-V nitrides can be designed to remain both insulating and piezoelectric to elevated temperatures, about 800° C., and have strong atomic bonds as well as a refractory nature, making it highly resistant to chemicals. In most cases, AlN (aluminum nitride) is preferred over GaN (gallium nitride) or InN (indium nitride) since AlN has superior piezoelectric and dielectric properties. AlN is an excellent piezoelectric material, with a relative dielectric constant of 8.5, piezoelectric constants of $e_{33}$=1.5 C/m$^2$ and $e_{31}$=−0.48 C/m$^2$, and an acoustic velocity of ≈5800 m/s. AlN has a hexagonal structure which is compatible with and may be grown on 6H—SiC (0001) or 4H—SiC (0001) substrates which have the same crystal structure and close match in lattice spacing. AlN epitaxial layers can also be grown onto (111) Si which, while having a cubic crystal structure, has the same in-plane crystal symmetry as hexagonal AlN.

6H—SiC, 4H—SiC, and (111) Si have a crystallographic orientation which provides base substrate 18 with the appropriate in-plane lattice structure (symmetry and spacing) onto which high quality single crystal III-V nitride piezoelectric layer 12 can be deposited. In addition, when employing 6H—SiC or 4H—SiC with III-V nitrides, the base substrate 18 and the piezoelectric layer 12 have nearly identical crystal structures, lattice constants, thermal expansion coefficients, and have a suitable match in stiffness and acoustic velocity resulting in improved performance of micromechanical device 10.

4H—SiC and 6H—SiC form the optimum base substrates 18 for epitaxial growth of III-V nitride semiconductors because both SiC and III-V nitride semiconductors have excellent chemical, mechanical, thermal and electrical properties, making the combination suitable for operation in hostile (high temperature and corrosive) environments considerably exceeding the capabilities of silicon-based sensors. SiC and AlN—GaN compounds have high (3.0–6.2 eV) band gaps, high melting/decomposition temperatures (1700–3000° C.), and are inert in most environments except molten metals and salts. SiC also has excellent high temperature mechanical stability and, as a consequence, can be employed in turbine engines to temperatures above 1000° C.

Although (111) silicon is sometimes employed as a base substrate 18 when lower costs are desired, the III-V nitride piezoelectric film 12 formed thereon typically has poorer quality (increased dislocation densities and internal stress) than if formed on 6H—SiC or 4H—SiC. However, piezoelectric AlN films of sufficient quality can be epitaxially grown onto (111) silicon surfaces, which has a favorable in-plane lattice structure (spacing and symmetry) for the growth of hexagonal III-V nitride semiconductors oriented with the c-axis perpendicular to the (111) silicon surface.

Figure 2A:
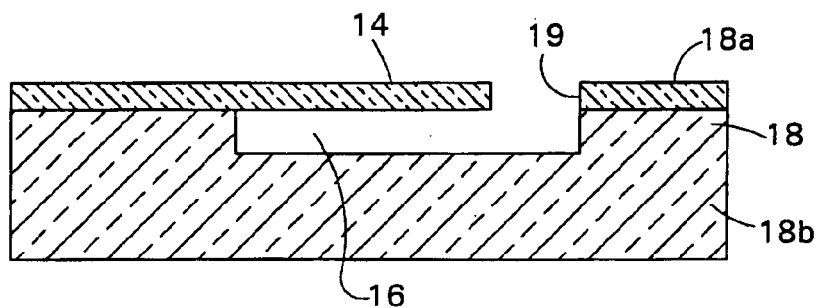
FIGS. 2A–2C are side sectional views depicting the formation of a micromechanical device according to one method.
Figure 2B:
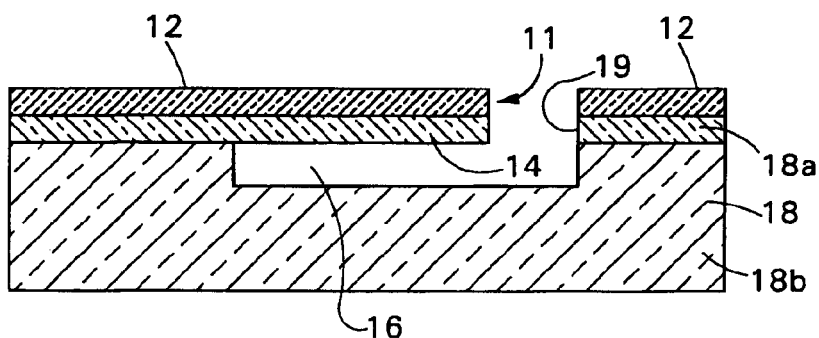
Figure 2C:
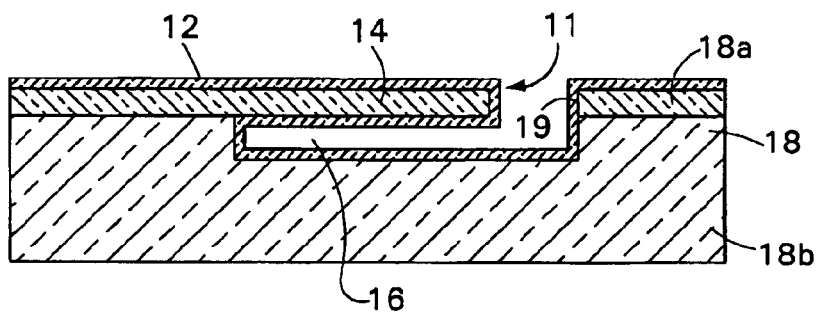

One method of manufacture of micromechanical piezoelectric device 10 using available micromachining techniques is depicted in FIGS. 2A–2C. A single crystal semiconductor base substrate 18 having an upper region 18$a$ and a lower region 18$b$, with one region being n-type and the other region being p-type, is prepared using standard semiconductor processing technologies (consisting of some combination of photolithography diffusion, implantation, epitaxy and etching). The typical thickness of upper region 18$a$ is between 0.2 and 10 microns, and is selected to achieve the desired mechanical properties (compliance, resonant frequency, flexural plate wave velocity, etc.) of the desired piezoelectric bimorph 11. Other thicknesses can also be chosen depending upon the situation at hand. The upper region 18$a$ is formed in such a way that it does not cover the lower region 18$b$ of substrate 18 in the areas where pattern 19 defines the outer lateral boundaries for micromechanical structure 14. A micromachining process is used to release the micromechanical structure 14 from substrate 18 by forming a cavity 16 in the lower region 18$b$ of substrate 18 below the micromechanical structure 14, in a way that does not attack the upper region 18$a$. Cavity 16 is typically formed by photoelectrochemical micromachining, which can form such micromechanical structures 14 with precise dimensional control (within +/–0.1 microns) from (111) silicon, 6H—SiC, 4H—SiC and other semiconductors. As a result, the micromechanical structure 14 has precisely controlled dimensions, as well as mechanical and electrical properties, such as stiffness, internal stress, density and conductivity. This provides uniformity, and reproducibility between different batches of piezoelectric devices 10 that are manufactured. Referring to FIG. 2B, a III-V nitride single crystal piezoelectric layer 12, for example, AlN is then epitaxially deposited on the micromechanical structure 14 and base substrate 18, thereby forming the piezoelectric bimorph 11. As previously mentioned, the material of the piezoelectric layer 12 is selected to have a crystal structure that is compatible to that of the base substrate 18 which enables the piezoelectric layer 12 to grow in single crystalline form over the base substrate. Piezoelectric layer 12 can be deposited by pulsed laser deposition, molecular beam epitaxy, or any physical vapor epitaxy that provides a shower of ions for depositing material only on top surfaces. Molecular beam epitaxy is the preferred method, since better dimensional control is obtained, thereby providing improved uniformity and reproducibility between different manufacturing batches of piezoelectric devices 10.

Referring to FIG. 2C, piezoelectric layer 12 can instead be applied to the single crystal base substrate 18 to cover all the exposed surfaces including those within cavity 16. The preferred methods of depositing piezoelectric layer 12 to cover all the exposed surfaces is by chemical vapor deposition and vapor phase epitaxy. As a result, the exposed top, bottom and sides of upper region 18$a$, micromechanical structure 14 and cavity 16 are all covered by the piezoelectric layer 12, such that micromechanical structure 14 is encapsulated by piezoelectric layer 12. Consequently, micromechanical structure 14 has minimal deflection resulting from any residual or thermally induced stress in piezoelectric layer 12 since a film is present on opposing sides of the micromechanical structure 14. Depending upon the material selected, the piezoelectric layer 12 may be suitable for also providing chemical, oxidation, mechanical and thermal protection to the micromechanical structure 14 and base substrate 18 due to the encapsulation.

The piezoelectric layer 12 in one embodiment has a thickness between 0.2 $\mu$m and 5 $\mu$m, with a thickness between 0.5 $\mu$m and 2 $\mu$m being typical. The thickness can vary depending upon the application at hand and other thicknesses can also be chosen. As previously mentioned, the piezoelectric layer 12 can consist primarily of AlN, of solid solutions of $Al_xGa_yIn_zN$ where x+y+z=1, or can be a multi-layered structure where layer compositions are chosen based on their mechanical (TCE, lattice constant, stiffness, acoustic velocity, etc.) and chemical properties to optimize the performance of micromechanical piezoelectric device 10.

The piezoelectric layer 12 is patterned by lithography and etched to remove the piezoelectric layer 12 from unwanted regions of the substrate 18 and micromechanical structure 14. The piezoelectric layer 12 can cover all or part of micromechanical structure 14. Referring to FIG. 1A and 1B, a metal layer 22 is next deposited and patterned to form electrode 22$a$ and contact 22$b$ to the top surface of piezoelectric layer 12 and another metal layer (or same) is deposited to form the electrical contact 24 on the upper region 18$a$ of substrate 18, which serves as the bottom electrode to piezoelectric layer 12. Electrode 22 can cover all or part of piezoelectric layer 12. The metals chosen are preferably highly conductive with low densities (such as aluminum), however, refractory and/or chemically stable metals (such as titanium, tungsten, platinum, gold, etc.) are appropriately selected to survive the temperatures and/or reactivity of the intended environment. The same metal is commonly used for both metal layer 22 and contact 24.

For some micromechanical piezoelectric devices 10 such as flexural plate wave acoustic sensors, electrode 22$a$ and contact 22$b$ can be patterned into two or more electrically isolated electrodes (such as interdigital electrodes) and, in some cases, electrical contact 24 is omitted. Electrode 22$a$ and electrical contact 22$b$ can be patterned to form two or more electrically isolated electrodes to the top of the piezoelectric device 10, such that one set is used as an actuator (for example, to drive the piezoelectric device 10 into resonance or to induce a flexural plate wave), and the other is used to measure the response of the actuated piezoelectric device 10 to an external stimulus.

Figure 3A:
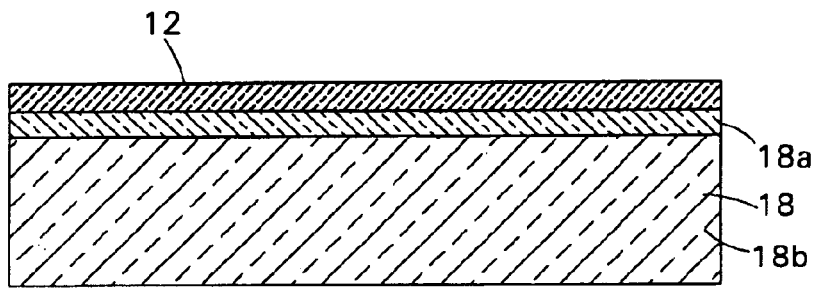
FIGS. 3A–3C are side sectional views depicting the formation of a micromechanical device according to another method.
Figure 3B:
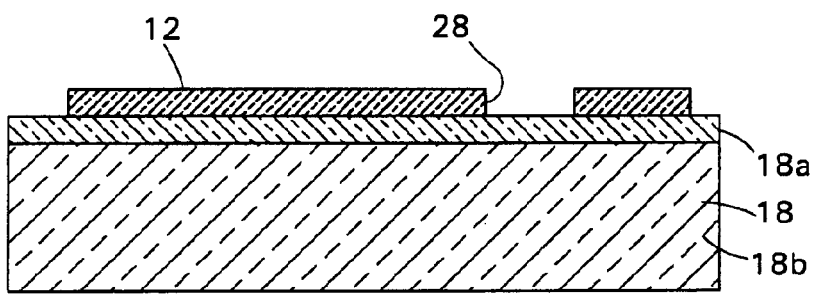
Figure 3C:
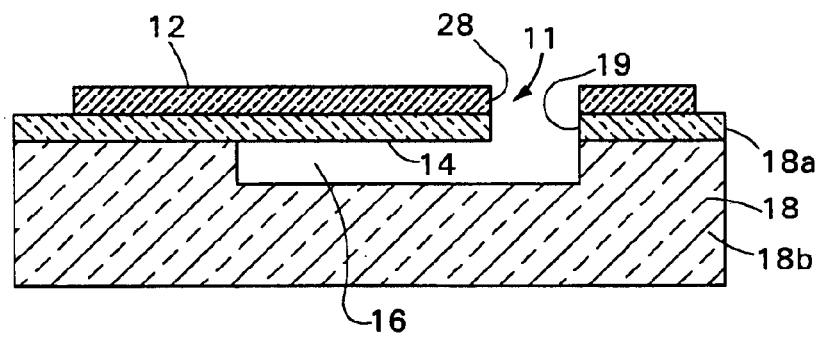

Another method for forming a micromechanical piezoelectric device 10 is depicted in FIGS. 3A–3C. In FIG. 3A, a piezoelectric layer 12 is first grown on a single crystal semiconductor base substrate 18. The base substrate has an upper region 18$a$ and a lower region 18$b$ with one region being n-type and the other region being p-type as in FIGS. 2A–2C. A selected pattern 28 of piezoelectric layer 12 is removed, by etching, as seen in FIG. 3B. Referring to FIG. 3C, some or all of the portions of the upper region 18$a$ of the base substrate exposed by the pattern 28 in the piezoelectric layer 12 are etched to form a pattern 19 through the upper region 18$a$. A cavity 16 is then etched into the lower region 18$b$ of base substrate 18 through the pattern 19 in the upper region 18a in a manner similar to that described relative to FIG. 2A. Cavity 16 extends under portions of upper region 18a to form micromechanical structure 14 and piezoelectric bimorph 11.

Figure 4A:
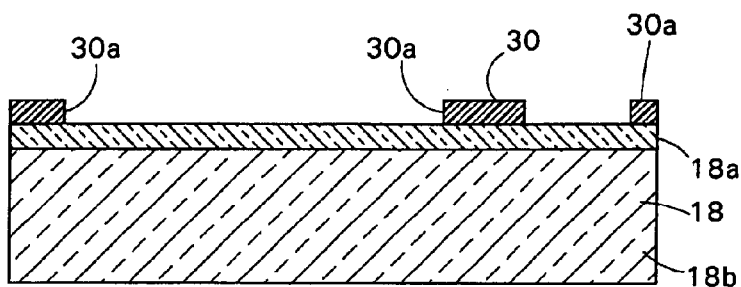
FIGS. 4A–4D, are side sectional views depicting the formation of a micromechanical device according to still another method.
Figure 4B:
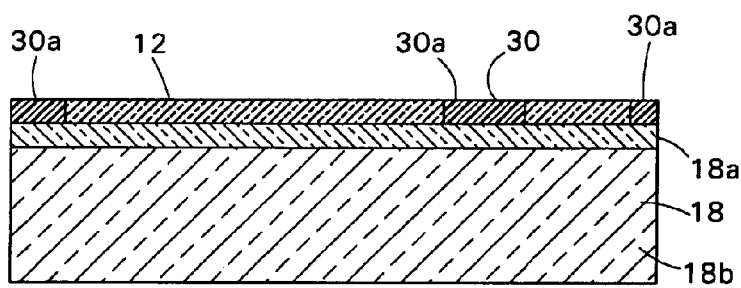
Figure 4C:
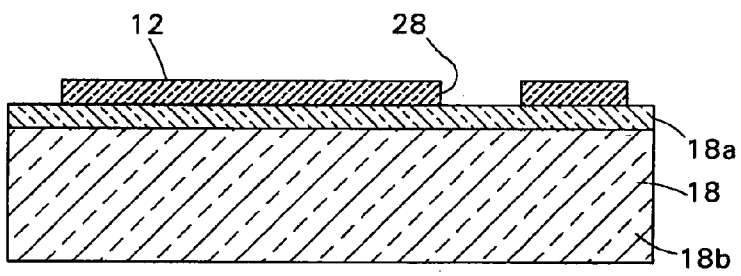
Figure 4D:
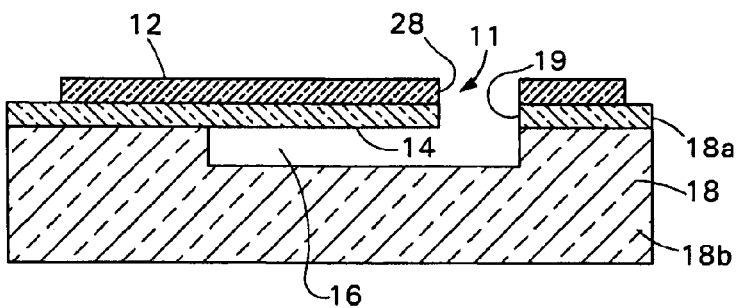

Another method of forming micromechanical device 10 is depicted in FIGS. 4A–4D. Referring to FIG. 4A, a layer of masking material 30, for example, amorphous or polycrystalline oxide, is deposited and selectively etched to form a pattern 30a on a single crystal semiconductor base substrate 18. Base substrate 18 has an upper region 18a and a lower region 18b of p and n type semiconductors as in FIGS. 2A–2C. The layer of masking material 30 is formed of a material such as silicon dioxide ($SiO_2$), on which piezoelectric layer 12 will not grow. Referring to FIG. 4B, piezoelectric layer 12 is epitaxially grown onto base substrate 18 and around the masked pattern 30a due to the fact that the piezoelectric layer 12 cannot grow on the masked pattern 30a, and either does not deposit at all, or deposits as an amorphous or polycrystalline film which can be selectively removed. Referring to FIG. 4C, the masked pattern 30a is removed by an etching process to form a pattern 28 through the piezoelectric layer 12. The pattern 28 exposes the upper region 18a of base substrate 18. Referring to FIG. 4D, the micromechanical structure 14 can then be etched in a manner similar to that described relative to FIG. 3C.

Figure 5A:
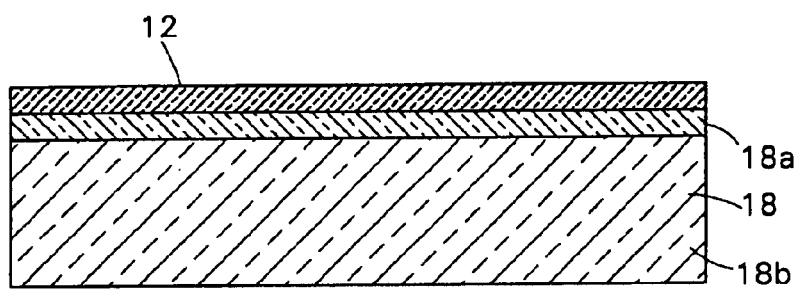
FIGS. 5A and 5B are side sectional views depicting the formation of a micromechanical device such as a membrane according to another method.
Figure 5B:
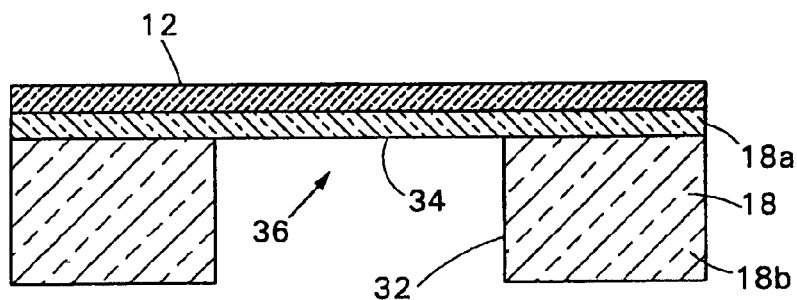

FIGS. 5A and 5B depict a method for forming a micromechanical structure such as a micromechanical membrane 34 having a piezoelectric layer 12. Referring to FIG. 5A, a piezoelectric layer 12 is deposited upon a single crystal semiconductor base substrate 18 having an upper region 18a and a lower region 18b of p and n type semiconductors as in FIGS. 2A–2C. Referring to FIG. 5B, the lower region 18b of base substrate 18 is etched on the side opposite to the piezoelectric layer 12 to form a recessed area or trough 32 which extends to the upper region 18a of base substrate 18. The upper region 18a of base substrate 18 exposed by the trough 32 forms a thin membrane 34 and the portion of piezoelectric layer 12 covering the membrane 34 forms piezoelectric bimorph membrane 36. Although the base substrate 18 depicted in FIGS. 5A and 5B preferably has both n-type and p-type regions to allow the use of p-n junction etch stops to precisely control the membrane thickness, alternatively, base substrate 18 can be entirely n-type or entirely p-type.

Figure 6A:
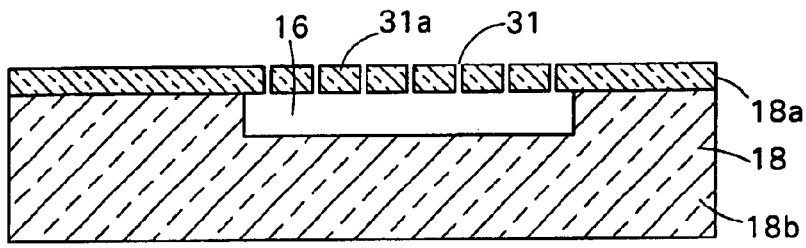
FIGS. 6A–6E are side sectional views depicting the formation of a micromechanical device according to still another method.

Another method of forming micromechanical device 10 is depicted in FIGS. 6A–6E. Referring to FIG. 6A, a single crystal semiconductor base substrate 18 having an upper region 18a and a lower region 18b, with one region being n-type and the other region being p-type, is prepared using standard semiconductor processing technologies (consisting of some combination of photolithography, diffusion, implantation, epitaxy and etching). The upper region 18a is formed in such a way that upper region 18a contains perforations 31 (small holes typically 0.2 μm to 5 μm in diameter) that extend through upper region 18a down to lower region 18b of substrate 18. A micromachining process is used to etch a cavity 16 in the lower region 18b of substrate 18 below the perforated upper layer 18a in a way that does not attack the upper region 18a to create micromechanical structure in the form of a perforated membrane 31a. Cavity 16 is typically formed by photoelectrochemical micromachining, which can form such micromechanical structures with precise dimensional control (within +/−0.1 microns) in (111) silicon, 6H—SiC, 4H—SiC and other semiconductors.

Figure 6B:
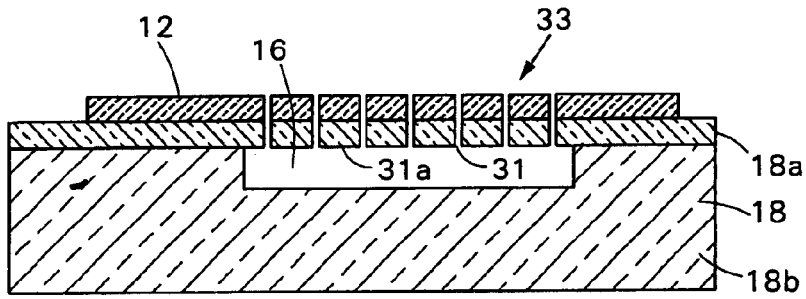
Figure 6C:
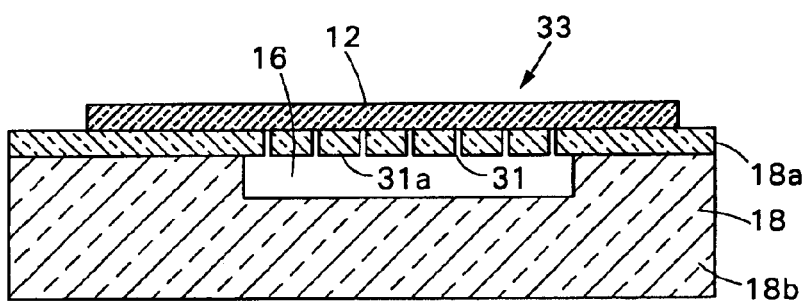

Referring to FIG. 6B, a III-V nitride single crystal piezoelectric layer 12, for example, AlN is then epitaxially deposited on the perforated membrane 31a to form a piezoelectric bimorph 33 in the form of a perforated membrane. Piezoelectric layer 12 can be deposited by pulsed laser deposition, molecular beam epitaxy, or any physical vapor epitaxy that provides a shower of ions for depositing material only on top surfaces. Referring to FIG. 6C, piezoelectric layer 12 can alternatively be grown on the perforated membrane 31a using chemical vapor deposition, vapor phase epitaxy, or other epitaxial growth processes that in which piezoelectric layer 12 grows both vertically and laterally resulting in the perforations 31 becoming sealed.

Figure 6D:
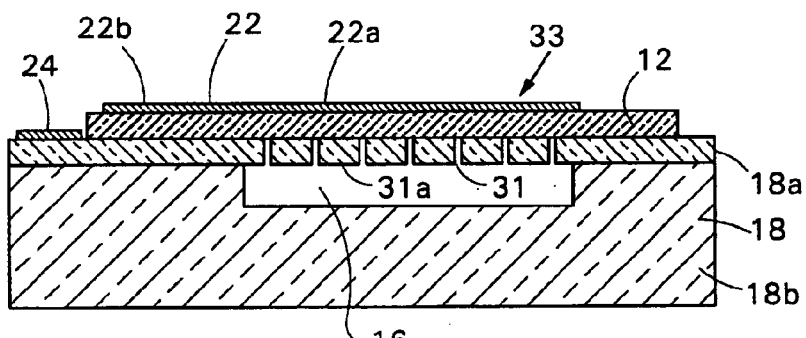
Figure 6E:
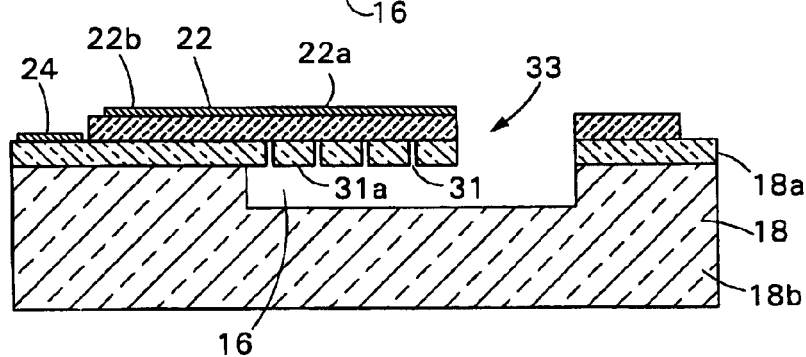

Referring to FIG. 6D, piezoelectric layer 12 can then be patterned by lithography and etched to remove the piezoelectric layer 12 from unwanted regions of the substrate 18 and perforated membrane 31a. A metal layer 22 can be deposited and patterned to form electrode 22a, electrical contacts 22b and electrical contact 24. Referring to FIG. 6E, perforated piezoelectric bimorph membrane 33 can be patterned using lithography and etching, typically using reactive ion etching, to remove portions of perforated piezoelectric bimorph membrane 33 to form piezoelectric bimorphs in the shape of cantilever beams, tethered proof masses and other structures.

It is understood that the manufacturing methods described above are examples which can be modified. For example, metal layer 22 depicted in FIG. 6D could be deposited and patterned after perforated piezoelectric bimorph membrane 33 is patterned as depicted in FIG. 6E.

Figure 7:
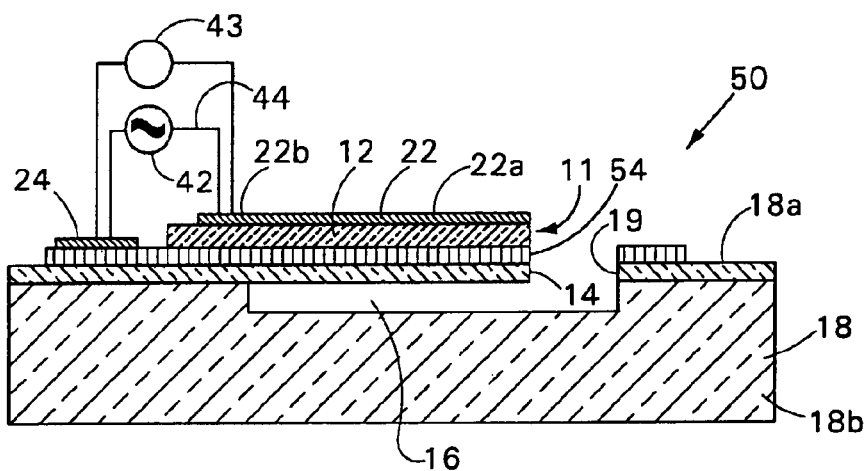
FIG. 7 is a side sectional view of another embodiment of a micromechanical piezoelectric device in the present invention.

Referring to FIG. 7, micromechanical piezoelectric device 50 is another embodiment of the present invention which differs from micromechanical piezoelectric device 10 in that the substrate 18 of piezoelectric device 50 includes a second n-doped or n-type layer 54 processed over a p-type upper region 18a and an n-type lower region 18b. Typically, the p-type upper region 18a and the second n-type layer 54 are each between 0.2 and 10 microns thick, with the thicknesses of each being selected to obtain the desired mechanical properties of piezoelectric device 50. Other thicknesses can also be chosen depending upon the situation at hand. The p-type upper region 18a and the second n-type layer 54 are formed in a manner not to cover the n-type lower region 18b of substrate 18 in regions of pattern 19 which define the outer lateral boundaries of micromechanical structure 14. N-type layer 54 can be further patterned using lithography and etching to remove portions of n-type layer 54 from p-type layer 18a. A photoelectrochemical micromachining process is typically used to form the micromechanical structure 14 from substrate 18 by forming cavity 16 below micromechanical structure 14 without attacking upper region 18a and the second n-type layer 54. Micromechanical structure 14 can be any of the micromechanical structures previously described above.

Piezoelectric layer 12 is formed over the second n-type layer 54 (and over any exposed p-type layer 18a if the n-type layer 54 was patterned) by epitaxial growth. The piezoelectric layer 12 is patterned by lithography and etched to remove portions of piezoelectric layer 12 from unwanted regions. Metal layer 22 for electrode 22a and electrical contact 22b is deposited onto piezoelectric layer 12. A metal layer for electrical contact 24 is deposited on the second n-type layer 54. The second n-type layer 54 allows a higher quality electrical contact 24 to be formed thereon than can be formed on a p-type layer, especially for SiC. In addition, the second n-type layer 54 has a lower resistivity in comparison to a p-type layer having the same doping density, and as a result, forms a more effective lower electrode to piezoelectric layer 12. Furthermore, the ability to pattern the n-type layer 54 provides additional flexibility for electrically isolating the bottom electrodes to the piezoelectric layer 12, either between adjacent micromechanical devices fabricated on the same base substrate 18, or between two or more electrodes fabricated on the same micromechanical device 10.

Figure 8:
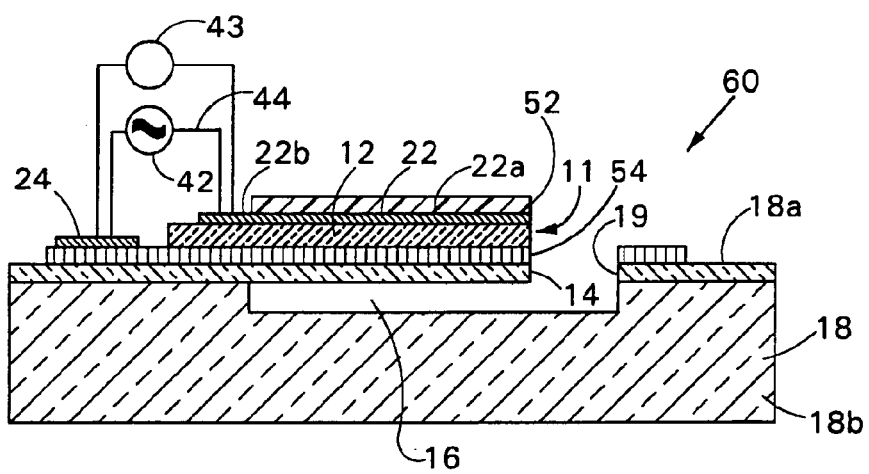
FIG. 8 is a side sectional view of yet another embodiment of a micromechanical piezoelectric device in the present invention.
Figure 9:
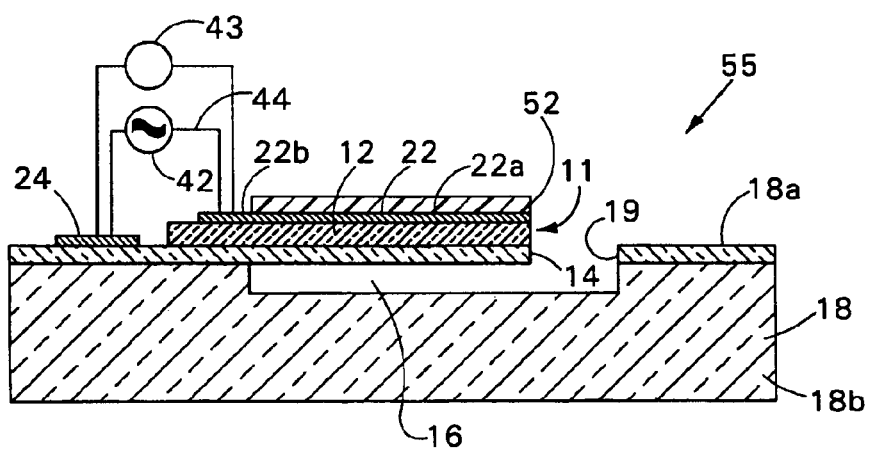
FIG. 9 is a side sectional view of still another embodiment of a micromechanical piezoelectric device in the present invention.

Referring to FIG. 8, micromechanical piezoelectric device 60 is another embodiment of the present invention which differs from micromechanical piezoelectric device 50 in that a substance sensitive layer 52 is formed on metal layer 22. The substance sensitive layer 52 is deposited over all or part of the portion of micromechanical device 60 capable of performing a mechanical motion, and depending upon the application at hand, can react to particular gases, chemicals, biological agents, etc., or species thereof. The substance sensitive layer 52 does not have to be on top of the metal electrode 22a. Neither the electrode 22a or piezoelectric layer needs to cover the entire portion of the micromechanical structure capable of performing a mechanical motion. Thus, it is possible for the substance sensitive layer 52 to be deposited directly on micromechanical structure 14, on piezoelectric layer 12, on electrode 22a, or combinations thereof. The substance sensitive layer 52, when subjected to the presence of the substance of interest, modifies the properties of the piezoelectric device 60, typically the resonant frequency or bending of piezoelectric bimorph 11. The substance sensitive layer 52 can be formed from a material such as a polymer, semiconductor, ceramic, or immobilized molecules, for example, antibodies, DNA, RNA, etc. Typically, depending upon the material from which substance sensitive layer 52 is formed, substance sensitive layer 52 can change in mass, volume, stress state, etc. These changes in the state of the substance sensitive layer 52 cause changes in the resonant frequency and/or static deflection of piezoelectric bimorph 11. In another embodiment of the present invention, the second n-type layer 54 can be omitted such as in micromechanical piezoelectric device 55, as seen in FIG. 9.

Figure 10:
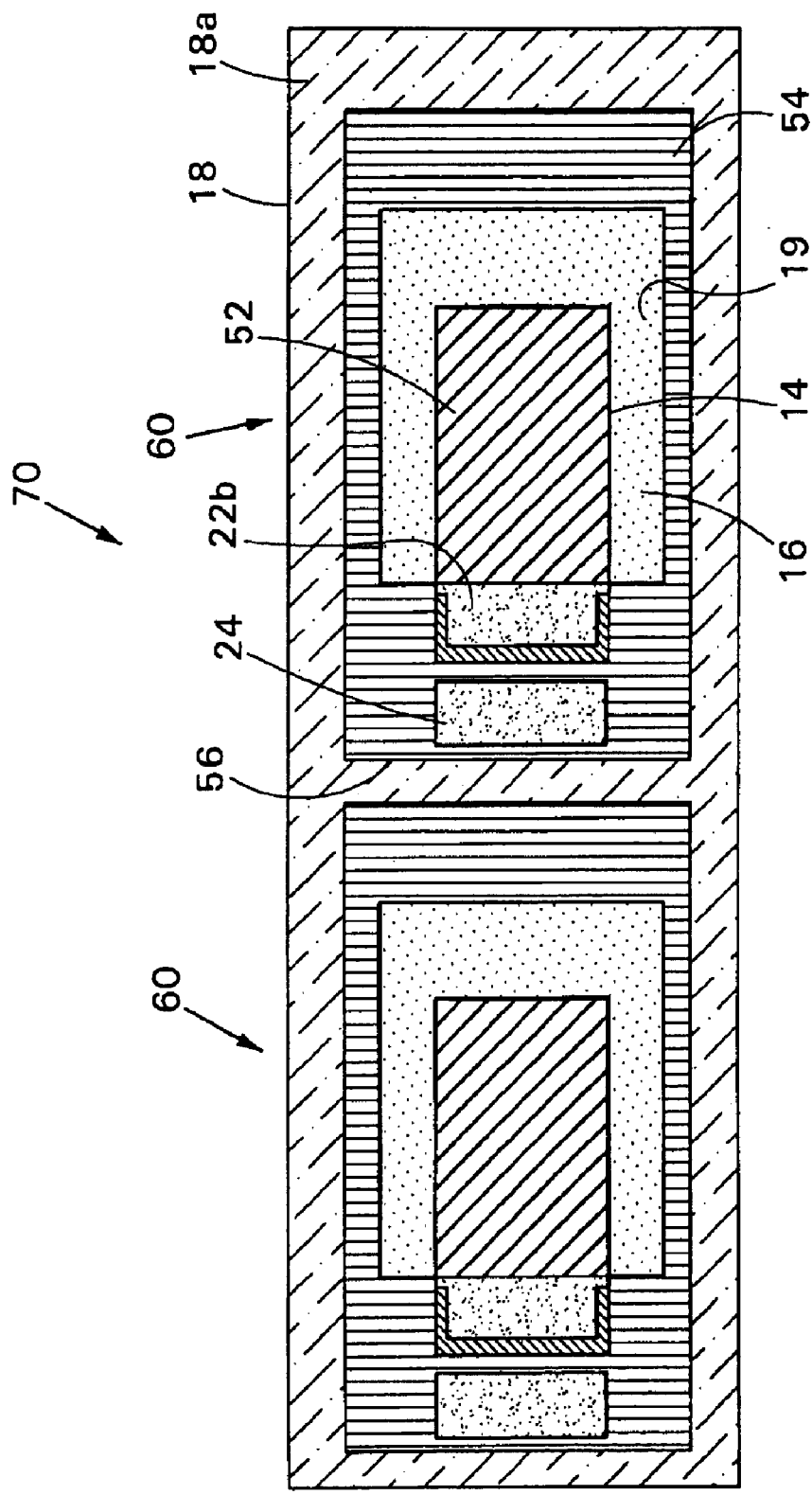
FIG. 10 is a plan view of a substrate having two micromechanical piezoelectric devices formed therein.

Referring to FIG. 10, micromechanical piezoelectric system 70 has a semiconductor base substrate 18 with two piezoelectric devices 60 formed therein. The second n-type layer 54 is formed in the shape of a mesa surrounding the micromechanical structures 14. This allows devices 60 to be electrically isolated from each other by a p-n junction 56. It is understood that the micromechanical structure 14 of the piezoelectric devices can be any one of the micromechanical structures previously described above. In addition, piezoelectric system 70 can include more than two piezoelectric devices 60, which, in turn, can include micromechanical structures 14 that differ from each other.

While this invention has been particularly shown and described with references to preferred embodiments thereof, it will be understood by those skilled in the art that various changes in form and details may be made therein without departing from the scope of the invention encompassed by the appended claims.

For example, the micromachining techniques employed for forming the micromechanical devices can be any known micromachining techniques such as chemical electrochemical, photo-electrochemical and reactive ion etching, or any combination thereof. In addition, the use of single crystal materials allows the micromechanical devices of the present invention to be incorporated on the same wafer with other electronic devices such as amplifiers, processors etc., or more than one micromechanical device. Also, more than one epitaxial layer may be deposited upon a micromechanical structure. The multiple epitaxial layers may be on top of each other or side by side. Various features of the embodiments described above can be omitted or combined. Depending on the semiconductor material from which the micromechanical structure capable of performing a micromechanical motion is formed, and the micromachining processes used to form the structure, the substrate 18b may either be n-type and layer 18a p-type, or the substrate 18b may be p-type and layer 18a n-type, with layer 54 being n-type in the first example and p-type in the second example. Finally, although terms such as upper, lower, bottom, etc., have been used to describe the present invention, such terms merely describe the position of features relative to each other and are not meant to limit the orientation of the present invention.

What is claimed is:

1. A micromechanical device comprising:
    a single crystal micromachined micromechanical structure, at least a portion of the micromechanical structure capable of performing a mechanical motion; and
    a piezoelectric epitaxial layer covering at least a part of said portion of the micromechanical structure that is capable of performing a mechanical motion, the micromechanical structure and piezoelectric epitaxial layer being composed of different materials; and
    at least one electrically conductive layer covering at least part of the piezoelectric epitaxial layer.

2. The device of claim 1 in which the micromechanical structure is formed from an electrically conductive semiconductor substrate.

3. The device of claim 2 further comprising at least one electrical contact formed to the micromechanical structure, said electrical contact being electrically connected to the portion of the micromechanical structure capable of performing a mechanical motion.

4. The device of claim 3 further comprising an electrical source connected between at least one electrically conductive layer covering at least part of the piezoelectric epitaxial layer and at least one electrical contact formed to the micromechanical structure.

5. The device of claim 3 further comprising a measuring device connected between at least one electrically conductive layer covering at least part of the piezoelectric epitaxial layer and at least one electrical contact formed to the micromechanical structure.

6. The device of claim 10 further comprising a substance sensitive layer over at least a portion of the micromechanical structure that is capable of performing a mechanical motion.

7. The device of claim 1 in which the at least one electrically conductive layer is an interdigital electrode.

8. The device of claim 1 in which the portion of the micromechanical structure capable of performing a mechanical motion is one of a microcantilever, microbridge, membrane, perforated membrane, tethered proof mass and tethered plate.

9. A micromechanical device comprising:
    a single crystal micromachined micromechanical structure formed from a material selected from the group consisting of SiC and Si, at least a portion of the micromechanical structure capable of performing a mechanical motion; and
    a piezoelectric epitaxial layer covering at least a part of said portion of the micromechanical structure that is capable of performing a mechanical motion, the piezoelectric epitaxial layer being formed of AlGaInN solid solution; and at least one electrically conductive layer covering at least part of the piezoelectric epitaxial layer.

10. The device of claim 9 in which the piezoelectric epitaxial layer is formed of AlN.

11. The device of claim 9 in which the micromechanical structure is formed from one of 6H—SiC and 4H—SiC.

12. The device of claim 9 in which the micromechanical structure is formed of (111) Si.

13. The device of claim 9 in which the micromechanical structure is electrically conductive.

14. The device of claim 13 further comprising at least one electrical contact formed to the micromechanical structure, said electrical contact being electrically connected to the portion of the micromechanical structure capable of performing a mechanical motion.

15. The device of claim 14 further comprising an electrical source connected between at least one electrically conductive layer covering at least part of the piezoelectric epitaxial layer and at least one electrical contact formed to the micromechanical structure.

16. The device of claim 14 further comprising a measuring device connected between at least one electrically conductive layer covering at least part of the piezoelectric epitaxial layer and at least one electrical contact formed to the micromechanical structure.

17. The device of claim 9 further comprising a substance sensitive layer over at least a portion of the micromechanical structure that is capable of performing a mechanical motion.

18. The device of claim 9 in which the at least one electrically conductive layer is an interdigital electrode.

19. The device of claim 9 in which the portion of the micromechanical structure capable of performing a mechanical motion is one of a microcantilever, microbridge, membrane, perforated membrane, tethered proof mass and tethered plate.

20. A micromechanical device comprising:

a single crystal micromachined micromechanical structure formed from a material selected from the group consisting of 6H—SiC, 4H—SiC and (111) Si, at least a portion of the micromechanical structure capable of performing a mechanical motion; and a piezoelectric epitaxial layer covering at least a part of said portion of the micromechanical structure that is capable of performing a mechanical motion, the piezoelectric epitaxial layer being formed of AlGaInN solid solution; and at least one electrically conductive layer covering at least part of the piezoelectric epitaxial layer.

21. The device of claim 20 in which the piezoelectric epitaxial layer is formed of AlN.

22. The device of claim 20 in which the micromechanical structure is formed from a substrate having a p-type region over a first n-type region, the portion of the micromechanical structure capable of performing a mechanical motion being composed of a portion of the p-type region suspended over a cavity in the n-type region.

23. The device of claim 22 further comprising at least one electrical contact formed to the p-type region of the micromechanical structure, said electrical contact electrically connected via the p-type region to the portion of the micromechanical structure capable of performing a mechanical motion.

24. The device of claim 23 further comprising an electrical source connected between at least one electrically conductive layer covering at least part of the piezoelectric epitaxial layer and at least one electrical contact formed to the micromechanical structure.

25. The device of claim 23 further comprising a measuring device connected between at least one electrically conductive layer covering at least part of the piezoelectric epitaxial layer and at least one electrical contact formed to the micromechanical structure.

26. The device of claim 20 further comprising a substance sensitive layer over at least a portion of the micromechanical structure that is capable of performing a mechanical motion.

27. The method of claim 22 further comprising forming the micromechanical structure from a substrate further including a second n-type region over at least a portion of the p-type region, such that at least a portion of the micromechanical structure capable of performing a mechanical motion being composed of said second n-type region covering a p-type region.

28. The device of claim 27 further at least one electrical contact formed to the second n-type region of the micromechanical structure, said electrical contact electrically connected via the second n-type region to the portion of the micromechanical structure capable of performing a mechanical motion.

29. The device of claim 28 further comprising an electrical source connected between at least one electrically conductive layer covering at least part of the piezoelectric epitaxial layer and at least one electrical contact formed to the micromechanical structure.

30. The device of claim 28 further comprising a measuring device connected between at least one electrically conductive layer covering at least part of the piezoelectric epitaxial layer and at least one electrical contact formed to the micromechanical structure.

31. The device of claim 27 further comprising a substance sensitive layer over at least a portion of the micromechanical structure that is capable of performing a mechanical motion.

32. The device of claim 20 in which the at least one electrically conductive layer is an interdigital electrode.

33. The device of claim 20 in which the portion of the micromechanical structure capable of performing a mechanical motion is one of a microcantilever, microbridge, membrane, perforated membrane, tethered proof mass and tethered plate.

* * * * *

UNITED STATES PATENT AND TRADEMARK OFFICE
CERTIFICATE OF CORRECTION

PATENT NO. : 6,953,977 B2
DATED : October 11, 2005
INVENTOR(S) : Richard Mlcak, Dharanipal Doppalapudi and Harry L. Tuller It is certified that error appears in the above-identified patent and that said Letters Patent is hereby corrected as shown below:

Column 12,
Line 46, delete "claim 10" and insert -- claim 1 --.

Column 14,
Line 29, delete "claim 27 further at least" and insert -- claim 27 further comprising at least --.

Signed and Sealed this

Third Day of January, 2006

JON W. DUDAS
*Director of the United States Patent and Trademark Office*